United States Patent

Denison et al.

[11] Patent Number: 6,042,901
[45] Date of Patent: *Mar. 28, 2000

[54] METHOD FOR DEPOSITING FLUORINE DOPED SILICON DIOXIDE FILMS

[75] Inventors: Dean R. Denison, San Jose; James Lam, Oakland, both of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/604,018

[22] Filed: Feb. 20, 1996

[51] Int. Cl.$^7$ .............................. H01L 21/02; H05H 1/24
[52] U.S. Cl. ..................... 427/579; 427/563; 427/574; 438/788
[58] Field of Search .................... 427/563, 574, 427/579, 573; 437/238; 438/788, 789

[56] References Cited

U.S. PATENT DOCUMENTS

| | | | |
|---|---|---|---|
| 3,993,509 | 11/1976 | McGinty . | |
| 4,328,646 | 5/1982 | Kaganowicz | 427/579 |
| 4,340,462 | 7/1982 | Koch . | |
| 4,384,918 | 5/1983 | Abe . | |
| 4,401,054 | 8/1983 | Matsuo et al. . | |
| 4,401,504 | 8/1983 | Kobayashi | 156/505 |
| 4,902,934 | 2/1990 | Miyamura et al. . | |
| 4,948,458 | 8/1990 | Ogle . | |
| 5,200,232 | 4/1993 | Tappan et al. . | |
| 5,429,995 | 7/1995 | Nishiyama et al. | 427/563 |
| 5,492,736 | 2/1996 | Laxman et al. | 427/579 |
| 5,571,571 | 11/1996 | Musaka et al. | 427/563 |
| 5,571,576 | 11/1996 | Qian et al. | 427/579 |
| 5,571,578 | 11/1996 | Kaji et al. | 427/579 |
| 5,750,211 | 5/1998 | Weise et al. | 427/579 |
| 5,827,785 | 10/1998 | Bhan et al. | 427/579 |
| 5,869,149 | 2/1999 | Denison et al. | 427/579 |
| 5,872,065 | 2/1999 | Sivaramakrishnan | 427/563 |
| 5,937,232 | 8/1999 | Orczyk et al. | 427/579 |
| 5,948,485 | 9/1999 | Amano et al. | 427/579 |

FOREIGN PATENT DOCUMENTS

| | | |
|---|---|---|
| 0517548 A2 | 12/1992 | European Pat. Off. . |
| 0599730 A2 | 6/1994 | European Pat. Off. . |

OTHER PUBLICATIONS

*Preparation of SiOF Films With Low Dielectric Constant by ECR Plasma CVD*, T. Fukada et al., (Feb. 21–22, 1995), DUMIC Conference, pp. 43–46.

*High Density Plasma Deposition and Deep Submicron Gap Fill With Low Dielectric Constant SiOF Films*, L.Q. Qian et al., (Feb. 21–22, 1995), DUMIC Conference, pp. 50–56.

*Dual Frequency Plasma CVD Fluorosilicate Glass Water Absorption and Stability*, M.J. Shapiro et al., (Feb. 21–22, 1995), DUMIC Conference, pp. 118–123.

(List continued on next page.)

*Primary Examiner*—Marianne Padgett
*Attorney, Agent, or Firm*—Burns, Doane, Swecker & Mathis, L.L.P.

[57] ABSTRACT

A process of preparing a moisture-resistant fluorine containing silicon oxide film includes steps of supplying reactant gases containing silicon, oxygen and fluorine into a process chamber and generating plasma in the process chamber, supporting a substrate on a substrate support in the process chamber and growing a fluorine-containing silicon oxide film on the substrate by contacting the substrate with the plasma while maintaining temperature of the film above 300° C. The silicon and fluorine reactants can be supplied by separate gases such as $SiH_4$ and $SiF_4$ or as a single $SiF_4$ gas and the oxygen reactant can be supplied by a pure oxygen gas. The $SiH_4$ and $SiF_4$ can be supplied in a gas flow ratio of $SiH_4/(SiH_4+SiF_4)$ of no greater than 0.5. The process can provide a film with a fluorine content of 2–12 atomic percent and argon can be included in the plasma to assist in gap filling. The plasma can be a high density plasma produced in an ECR, TCP™, or ICP reactor and the substrate can be a silicon wafer including one or more metal layers over which the fluorine-containing silicon oxide film is deposited. The substrate support can include a gas passage which supplies a temperature control gas into a space between opposed surfaces of the substrate and the substrate support for maintaining the substrate at a desired temperature.

16 Claims, 2 Drawing Sheets

OTHER PUBLICATIONS

*Comparison of PECVD F–TEOS Films and High Density Plasma SiOF Films,* D. Carl et al., (Jun. 27–29, 1995), VMIC Conference, pp. 97–103.

*Water–absorption Mechanisms of F–doped PECVD $SiO_2$ with Low–dielectric Constant,* H. Miyajima et al., (Jun. 27–29, 1995), VMIC Conference, pp. 391–393.

*Controlling Fluorine Concentration and Thermal Annealing Effect on Liquid–Phase Deposited $SiO_{2-x}F_x$ Films,* Ching–Fa Yeh et al., (Oct. 1995), J. Electrochem Soc., vol. 142, No. 10, pp. 3579–3593.

*An Evaluation of Fluorine Doped Peteos on Gap Fill Ability and Film Characterization,* K. Hewes et al. No date or Source.

METHOD FOR DEPOSITING FLUORINE DOPED SILICON DIOXIDE FILMS

FIELD OF THE INVENTION

The invention relates to the deposition of fluorine doped silicon dioxide films having improved stability.

BACKGROUND OF THE INVENTION

CVD apparatus is conventionally used to form various thin films in a semiconductor integrated circuit. Such CVD apparatus can form thin films such as $SiO_2$, $Si_3N_4$, Si or the like with high purity and high quality. In the reaction process of forming a thin film, a reaction vessel in which semiconductor substrates are arranged can be heated to a high temperature condition of 500 to 1000° C. Raw material to be deposited can be supplied through the vessel in the form of gaseous constituents so that gaseous molecules are thermally disassociated and combined in the gas and on a surface of the substrates so as to form a thin film.

A plasma-enhanced CVD apparatus utilizes a plasma reaction to create a reaction similar to that of the above-described CVD apparatus, but at a relatively low temperature in order to form a thin film. The plasma CVD apparatus includes a process chamber consisting of a plasma generating chamber which may be separate from or part of a reaction chamber, a gas introduction system, and an exhaust system. For example, such a plasma-enhanced CVD apparatus is disclosed in U.S. Pat. No. 4,401,504 and commonly-owned U.S. Pat. No. 5,200,232. Plasma is generated in such an apparatus by a high density microwave discharge through electron-cyclotron resonance (ECR). A substrate table is provided in the reaction chamber, and plasma generated in the plasma formation chamber passes through a plasma extracting orifice so as to form a plasma stream in the reaction chamber. The substrate table may include a radiofrequency (RF) biasing component to apply an RF bias to the substrate and a cooling mechanism in order to prevent a rise in temperature of the substrate due to the plasma action.

A plasma apparatus using high density ECR for various processes such as deposition, etching and sputtering to manufacture semiconductor components is disclosed in U.S. Pat. No. 4,902,934. Such a plasma apparatus includes an electrostatic chuck (ESC) for holding a substrate (such as a silicon wafer) in good thermal contact and in a vertical orientation. The chuck can also be provided with cooling and heating capabilities. In general, such reaction chambers can be operated under vacuum conditions, and the plasma generation chamber can be enclosed by walls which are water-cooled. Other types of reactors in which deposition can be carried out include parallel plate reactors and high density transformer coupled plasma (TCP)™, a trademark of the assignee Lam Research Corporation, also called inductively coupled plasma (ICP), reactors of the type disclosed in commonly owned U.S. Pat. Nos. 4,340,462 and 4,948,458.

Electrostatic chucking devices are disclosed in U.S. Pat. Nos. 3,993,509; 4,184,188; and 4,384,918. With such systems, a wafer substrate is typically located on a dielectric layer, and the wafer supporting surface of such electrostatic chucking arrangements can be larger or smaller than the wafer substrate supported thereon. The electrostatic voltage and RF bias are applied to an electrode buried within a dielectric layer and proximate to the wafer/substrate contact surface.

In semiconductor processing, devices are being built with smaller wiring pitches and larger interconnect resistances. In order to reduce delays in critical speed paths, it has been proposed to embed low dielectric constant material between adjacent metal lines or lower the dielectric constant of the intermetal dielectric material by adding fluorine thereto. A paper presented at the Feb. 21–22, 1995 DUMIC Conference by L. Qian et al., entitled "High Density Plasma Deposition and Deep Submicron Gap Fill with Low Dielectric Constant SiOF Films" describes deposition of up to 10 atomic % fluorine-containing moisture resistant SiOF films on a silicon sample at room temperature using high density plasma. This paper states that fluorine in the film can be reduced by adding hydrogen to the $SiF_4+O_2+Ar$ deposition gas chemistry, the film had a dielectric constant of 3.7, and the refractive index was lowest for deposition conditions where the $SiF_4:SiF_4+O_2$ ratio was 0.29.

Another paper presented at the DUMIC Conference is by D. Carl et al., entitled "Comparison of PECVD F-TEOS Films and High Density Plasma SiOF Films." This paper mentions that fluorinated TEOS films have been used for gap filling and compares such films to films deposited by high density plasma (HDP) inductively coupled plasma using $SiF_4+O_2+Ar$. The HDP films were found to have better moisture and thermal stability than the F-TEOS films.

Other papers presented at the DUMIC Conference include "Preparation of SiOF Films with Low Dielectric Constant by ECR Plasma CVD" by T. Fukada et al., "An Evaluation of Fluorine Doped PETEOS on Gap Fill Ability and Film Characterization" by K. Hewes et al., "Dual Frequency Plasma CVD Fluorosilicate Glass Water Absorption and Stability" by M. Shapiro et al., and "Water-absorption mechanisms of F-doped PECVD $SiO_2$ with Low-Dielectric Constant" by H. Miyajima et al. Of these, Fukada discloses that SiOF films deposited by RF biased ECR plasma are superior to SOG and TEOS-$O_3$ films, the SiOF films providing excellent planarization and sub half micron gap filling without voids. Moreover, according to Fukada, the dielectric constant of SiOF films can be reduced from 4.0 to 3.2 by increasing the $SiF_4/(SiF_4+SiH_4)$ gas flow ratio in an RF-biased ECR plasma CVD process using $SiF_4$, $SiH_4$ and $O_2$ gas reactants ($O_2(SiF_4+SiH_4)=1.6$) and a substrate held on a water cooled electrostatic chuck. Hewes discloses CVD of fluorosilicate glass films from TEOS, $O_2$ and $C_2F_6$ introduced into a reaction chamber by a showerhead gas mixer. Shapiro discloses that ULSI device speed can be increased by reducing capacitance of the interlevel insulator such as by adding fluorine to $SiO_X$ films but water incorporation into the films raises the dielectric constant and water evolution can produce voids or corrosion in surrounding metal. Miyajima discloses that water absorption of F-doped $SiO_2$ films containing more than 4% F is a serious problem because it causes degradation of device reliability and film adhesion properties and that the resistance to water absorption is lower for films deposited by parallel plate plasma CVD compared to high density helicon-wave plasma using TEOS, $O_2$ and $CF_4$ as deposition gases.

The effects of thermal annealing on the densification of $SiO_2$ prepared by liquid-phase deposition at 15° C. is described by C. Yeh et al., in "Controlling Fluorine Concentration and Thermal Annealing Effect on Liquid-Phase Deposited $SiO_{2-x}F_x$ Films", J. Electrochem, Vol. 142, No. 10, October 1995. Yeh discloses that restructuring occurs during annealing because H atoms between F and O atoms are very electronegative and annealing at 300 to 500° C. can break SiO—H bonds forming SiO$^-$ whereas annealing higher than 700° C. also breaks SiF bonds forming Si$^+$.

SUMMARY OF THE INVENTION

The invention provides a process of preparing a moisture-resistant fluorine-containing silicon oxide film, comprising steps of supplying reactant gases containing silicon, oxygen and fluorine into a process chamber and generating plasma in the process chamber, supporting a substrate on a substrate support, and growing a fluorine-containing silicon oxide film on the substrate by contacting the substrate with the plasma while maintaining temperature of the film above 300° C.

According to various aspects of the invention, the reactants, ratios thereof and/or the temperature of the substrate can be adjusted to enhance properties of the silicon oxide film. For instance, the silicon containing gas can comprise $SiF_4$ and $SiH_4$ gases or only $SiF_4$ gas and/or the $SiF_4$ and $SiH_4$ gases can be supplied into the process chamber in a gas flow ratio of $SiH_4/(SiH4+SiF_4)$ of no greater than 0.5. The temperature of the film can be controlled as a function of the $SiH_4/(SiH_4+SiF_4)$ gas flow ratio. For instance, during the growing step the temperature of the film can be maintained no lower than 360° C. while maintaining the gas flow ratio of $SiH_4/(SiH_4+SiF_4)$ no greater than 0.4 or the temperature of the film can be maintained no lower than 320° C. while maintaining the gas flow ratio of $SiH_4/(SiH_4+SiF_4)$ no greater than 0.3. The process can provide the film with a fluorine content of 2 to 12 atomic %. If desired, the gas may contain one or more additional components such as argon in an amount sufficient to assist in gap filling and/or the plasma can be a high density plasma. Further, the process can be carried out in the process chamber of an ECR or TCP™ (ICP) reactor. The substrate can be a semiconductor wafer and/or the film can be deposited over a metal layer on the substrate. Further, the substrate support can include a gas passage supplying a temperature control gas into a space between opposed surfaces of the substrate and the substrate support.

DETAILED DESCRIPTION OF THE PREFERRED EMBODIMENTS

The invention provides improvements in the stability of a fluorine doped film of silicon dioxide. Such fluorine doped films have low dielectric constants and are desirable in integrated circuit manufacture wherein substrates such as silicon wafers are coated with metal layers and dielectric intermetal layers. In order to reduce the RC time constant for signal propagation, reduce crosstalk, and reduce power consumption, fluorine doped silicon dioxide films having 2 to 12 atomic % fluorine achieve the desired effects by decreasing the inter-electrode capacitance. A problem arises, however, when such films are exposed to moisture such as atmospheric humidity or immersion in liquid such as during chemical/mechanical polishing of the substrates.

According to the invention it has been discovered that the moisture stability of fluorine doped silicon dioxide films can be improved at the time of deposition of the films. For instance, films more resistant to moisture degradation can be obtained by high density deposition using a mixture of silane ($SiH_4$) and tetrafluorosilane ($SiF_4$). The fluorine content and dielectric constant of the deposited film can be controlled by adjusting the ratio of the $SiH_4$ and $SiF_4$. The flux and energy of the oxygen from the plasma also affects the fluorine content and dielectric constant of the deposited film. Optionally, an inert gas such as argon can be added to the gas mixture to assist in gap filling.

In addition to controlling the ratio of reactants, the temperature of the growing film has been found to influence the moisture stability of the deposited film. However, as shown by the following table, the film temperature for achieving moisture stability depends at least in part on the gas flow ratio of $SiH_4$ to $SiF_4$. In general, lower film temperatures can be used with low $SiH_4/(SiH_4+SiF_4)$ gas flow ratios.

TABLE

| $SiH_4/(SiH_4 + SiF_4)$ Gas Flow Ratio | 280° C. | 320° C. | 360° C. |
|---|---|---|---|
| 0.0 | X | O | O |
| 0.1 | X | O | O |
| 0.2 | X | O | O |
| 0.3 | X | O | O |
| 0.4 | X | X | O |
| 0.5 | X | X | X |

In the above table, X's represent films which are not moisture resistant whereas O's represent moisture resistant films. Thus, it can be seen that it is desirable to maintain the temperature of the growing film above 280° C. and depending on the $SiH_4/(SiH_4+SiF_4)$ gas flow ratio it is also desirable to maintain the temperature at 320° C. and above or even 360° C. and above.

The process of the invention is preferably carried out in a high density plasma. Such a high density plasma can be produced in various reactors such as an ECR or TCP™ (ICP) reactor.

Figure 1:
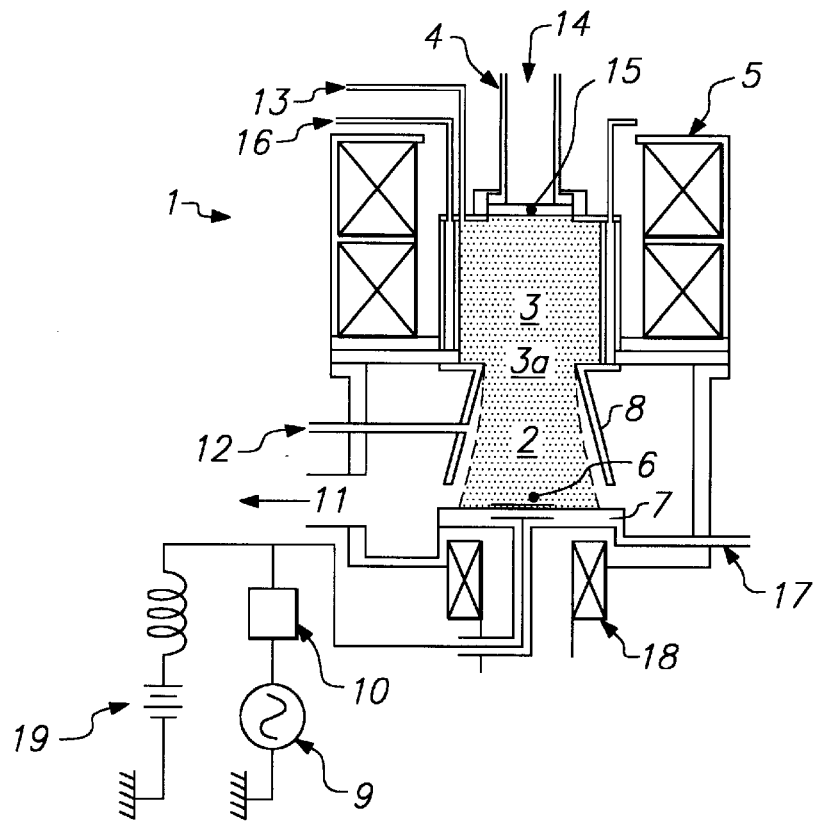
FIG. 1 is a schematic view of a high density plasma ECR reactor which can be used to carry out the process according to the invention.

FIG. 1 shows an ECR reactor 1 which can process a substrate with a high density plasma. The reactor includes a reaction chamber 2 wherein a substrate is subjected to treatment with a plasma gas. In order to generate the high density plasma, the reactor includes a plasma generating chamber 3 wherein a high density plasma is generated by the combination of microwave energy transmitted through microwave guide 4 and magnetic energy generated by electromagnetic coils 5. The high density plasma can be generated from a suitable gas or gas mixture such as oxygen and/or argon and an ion beam is extracted from the plasma chamber though orifice 3a. A substrate 6 is supported on a substrate support 7 such as an electrostatic chuck having a substrate temperature controlling mechanism associated therewith.

The high density plasma generated in chamber 3 can be confined within horn 8 and directed to the substrate 6 by applying an RF bias to the substrate by means of an RF source 9 and associated circuitry 10 for impedance matching, etc. The reaction chamber 2 is evacuated by a suitable vacuum arrangement represented generally by the evacuation port 11. In order to introduce one or more silicon and/or fluorine containing reactants into the high density plasma, the horn 8 can include one or more gas injection arrangements such as gas distributing rings on the inner periphery thereof whereby reactants such as $SiH_4$ and $SiF_4$ can be introduced into the high density plasma. The reactant or reactants can be supplied through one or more passages represented generally at 12. In order to produce a plasma in plasma generating chamber 3, oxygen and argon can be introduced into the plasma generating chamber 3 by one or more passages represented generally at 13.

Microwave energy represented by arrow 14 travels through dielectric window 15 and enters the plasma generating chamber 3, the walls of which are water cooled by water supply conduit 17. Electromagnetic coils 18 below substrate holder 7 are used for shaping the magnetic field in the vicinity of the substrate 6. A DC power source 19 provides power to the substrate holder 7 for electrostatically clamping substrate 6.

Figure 2:
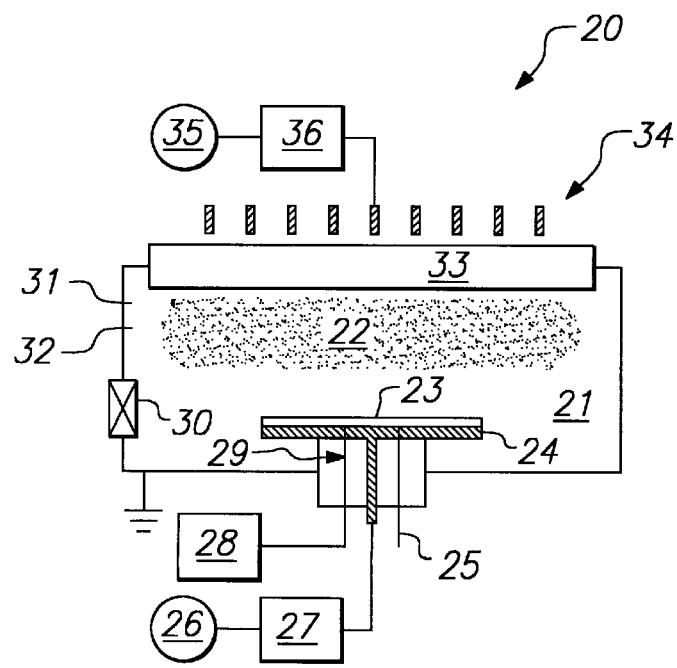
FIG. 2 is a schematic of a high density plasma TCP™ reactor which can be used to carry out the process according to the invention.

FIG. 2 shows a TCP™ reactor 20 which can process substrates with high density plasma. The reactor includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can comprise an aluminum electrode or a ceramic material having a buried electrode therein, the electrode being powered by an RF source 26 and associated circuitry 27 for providing RF matching, etc. The temperature of the substrate during processing thereof is monitored by temperature monitoring equipment 28 attached to temperature probe 29.

In order to provide a vacuum in chamber 21, a turbo pump is connected to outlet port 30 and a pressure control valve can be used to maintain the desired vacuum pressure. Reactants such as oxygen and silane can be supplied into the chamber by conduits 31, 32 which feed the reactant gases to a gas distribution ring extending around the underside of dielectric window 33 or the reactants can be supplied through a dielectric showerhead window. A TCP™ coil 34 located outside the chamber in the vicinity of the window is supplied RF power by RF source 35 and associated circuitry 36 for impedance matching, etc. When a substrate is processed in the chamber, the RF source 35 supplies the TCP™ coil 34 with RF current at 13.56 MHz and the RF source 26 supplies the lower electrode with RF current at 400 kHz.

Figure 3:
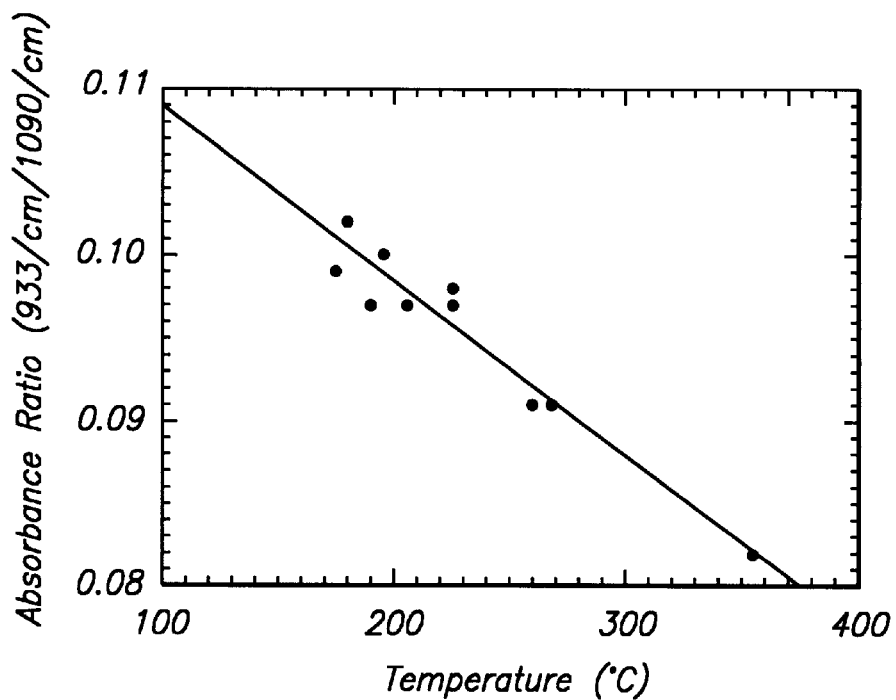
FIG. 3 shows a graph of film fluorine content versus film temperature during deposition.
Figure 4:
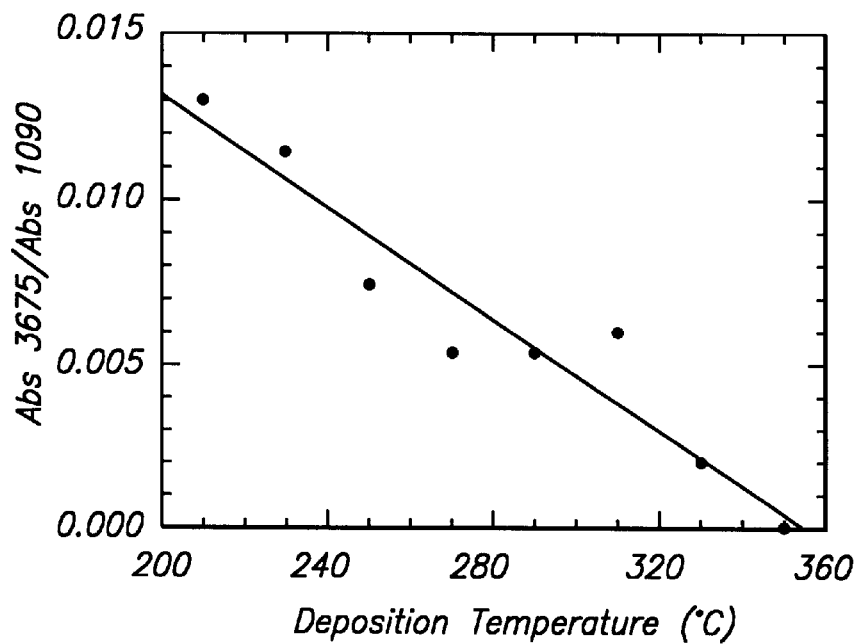
FIG. 4 shows a graph of moisture absorption versus film temperature during deposition.

FIGS. 3 and 4 show results of Fourier Transform Infrared Spectroscopy (FTIR). FIG. 3 shows a graph of film fluorine content versus film temperature during deposition whereas FIG. 4 shows a graph of moisture resistance of the fluorine-doped film determined by immersing the film in boiling deionized water for one hour and measuring the moisture absorption by FTIR. As can be seen from FIG. 3, wherein the Si-F absorption peak intensity near 933/cm and the Si—O absorption peak intensity near 1092/cm are shown as absorbance ratio 933/cm/1090/cm, for higher fluorine content films it is desirable to maintain the temperature of the film at lower temperatures during deposition thereof. As can be seen from FIG. 4, wherein the Si—OH absorption peak intensity near 3675/cm and the Si—O absorption peak intensity near 1090/cm are shown as absorbance ratio 3675/cm/1090/cm, maintaining the growing film at higher temperatures is beneficial in reducing the film's —OH content thus improving the moisture stability of the film.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process of preparing a moisture-resistant fluorine-containing silicon oxide film, comprising steps of:
    supplying reactant gases containing silicon, oxygen and fluorine into a process chamber and generating plasma in the process chamber, the reactant gases including $SiF_4$ and $SiH_4$ in a $SiH_4/(SiH_4+SiF_4)$ gas flow ratio;
    supporting a substrate on a substrate support; and
    growing the fluorine-containing silicon oxide film on the substrate by contacting the substrate with the plasma while maintaining temperature of the growing film above 300° C., the temperature of the growing film being controlled as a function of the $SiH_4/(SiH_4+SiF_4)$ gas flow ratio so that the growing film is moisture resistant, the growing film having a fluorine content of 2 to 12 atomic %.

2. The process of claim 1, wherein the reactant gases consist of the $SiF_4$ and $SiH_4$ gases.

3. The process of claim 2, wherein the $SiF_4$ and $SiH_4$ gases are supplied into the process chamber in a gas flow ratio of $SiH_4/(SiH_4+SiF_4)$ of less than 0.5.

4. The process of claim 3, wherein the temperature of the film is controlled as a function of fluorine content of the film, the temperature being lower for higher fluorine content films.

5. The process of claim 4, wherein during the growing step the temperature of the film is maintained no lower than 360° C. and the gas flow ratio of $SiH_4/(SiH_4+SiF_4)$ is no greater than 0.4.

6. The process of claim 4, wherein during the growing step the temperature of the film is maintained no lower than 320° C. and the gas flow ratio of $SiH_4/(SiH_4+SiF_4)$ is no greater than 0.3.

7. The process of claim 1, wherein the process is a gap filling process wherein the silicon oxide film is deposited in gaps between electrically conductive lines on the substrate, the gas containing argon in an amount sufficient to assist in gap filling.

8. The process of claim 1, wherein the plasma is a high density plasma.

9. The process of claim 8, wherein the process is carried out in the process chamber of an electron cyclotron resonance plasma apparatus.

10. The process of claim 8, wherein the process is carried out in the process chamber of inductively coupled plasma apparatus.

11. The process of claim 1, wherein the substrate is a semiconductor wafer.

12. The process of claim 1, wherein the film is deposited over a metal layer.

13. The process of claim 1, wherein the substrate support includes a gas passage supplying a temperature control gas into a space between opposed surfaces of the substrate and the substrate support.

14. A process of preparing a moisture-resistant fluorine-containing silicon oxide film, comprising steps of:
    supplying reactant gases containing silicon, oxygen and fluorine into a process chamber and generating plasma in the process chamber;
    supporting a substrate on a substrate support; and
    growing the fluorine-containing silicon oxide film on the substrate by contacting the substrate with the plasma while maintaining temperature of the growing film above 300° C., the reactant gases including $SiF_4$ and $SiH_4$ supplied in a gas flow ratio of $SiH_4/(SiH_4+SiF_4)$ of less than 0.5 and the plasma being a high density plasma, the temperature of the growing film being controlled as a function of the fluorine content of the growing film so that the growing film is moisture resistant, and the growing film having a fluorine content of 2 to 12 atomic %.

15. The process of claim 14, wherein the silicon oxide is deposited during a gap filling process.

16. The process of claim 14, wherein the substrate support includes an electrode applying a radio frequency bias to the substrate.

* * * * *